(12) United States Patent
Silha et al.

(10) Patent No.: US 11,855,468 B2
(45) Date of Patent: *Dec. 26, 2023

(54) BATTERY CHARGER INCLUDING AN ISOLATING MEMBER

(71) Applicant: MILWAUKEE ELECTRIC TOOL CORPORATION, Brookfield, WI (US)

(72) Inventors: Wyatt R. Silha, Milwaukee, WI (US); Cameron R. Schulz, Milwaukee, WI (US); Kyle C. Fassbender, Brookfield, WI (US); Zhi Wei Meng, Dongguan (CN)

(73) Assignee: Milwaukee Electric Tool Corporation, Brookfield, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/061,578

(22) Filed: Dec. 5, 2022

(65) Prior Publication Data
US 2023/0170714 A1    Jun. 1, 2023

Related U.S. Application Data

(63) Continuation of application No. 16/655,684, filed on Oct. 17, 2019, now Pat. No. 11,523,510.

(30) Foreign Application Priority Data

Oct. 17, 2018 (CN) .......................... 201821688208.7

(51) Int. Cl.
*H01M 10/46* (2006.01)
*H02J 7/00* (2006.01)
(Continued)

(52) U.S. Cl.
CPC ........... *H02J 7/0042* (2013.01); *H01M 10/44* (2013.01); *H02J 7/0013* (2013.01); *H02J 7/0045* (2013.01);
(Continued)

(58) Field of Classification Search
CPC .... H02J 7/00047; H02J 7/0047; H02J 7/0045; H02J 7/0013; H02J 7/00309;
(Continued)

(56) References Cited

U.S. PATENT DOCUMENTS 5,297,025 A  3/1994 Shoquist et al.
5,647,450 A  7/1997 Ogawa et al.
(Continued)

FOREIGN PATENT DOCUMENTS

CA  1340662 C  7/1999
CA  2661165 A1  1/2008
(Continued)

OTHER PUBLICATIONS

Extended European Search Report for Application No. 19874738.8 dated Jul. 5, 2022 (10 pages).

*Primary Examiner* — Edward Tso
(74) *Attorney, Agent, or Firm* — Michael Best & Friedrich LLP

(57) ABSTRACT

A battery charger may include a printed circuit board (PCB) having a first portion supporting alternating current (AC) electrical components and a second portion supporting direct current (DC) electrical components; an indicator including a light-emitting diode (LED) supported on the first portion of the PCB and operable to emit light; and an isolating member positioned on the first portion between the AC electrical components and the LED. A trace on the PCB may be electrically connected to the second portion of the PCB, the trace extending from the second portion and along the first portion, and the LED may be electrically connected to and receiving DC power through the trace, the LED being selectively positioned along a length of the trace. The LED may be positioned more than about 8 mm from the AC electrical components.

20 Claims, 13 Drawing Sheets

(51) Int. Cl.
*H05K 1/18* (2006.01)
*H01M 10/44* (2006.01)
*H05K 7/20* (2006.01)
*H05K 1/02* (2006.01)

(52) U.S. Cl.
CPC ........ *H02J 7/0047* (2013.01); *H02J 7/00047* (2020.01); *H02J 7/00309* (2020.01); *H05K 1/0295* (2013.01); *H05K 1/18* (2013.01); *H05K 7/20154* (2013.01); *H05K 7/20209* (2013.01); *H05K 2201/066* (2013.01); *H05K 2201/10106* (2013.01); *H05K 2201/10522* (2013.01)

(58) Field of Classification Search
CPC ....... H02J 7/0042; H05K 1/0295; H05K 1/18; H05K 7/20154; H05K 7/20209; H05K 2201/10522; H05K 2201/10106; H05K 2201/066; H01M 10/44; H01M 10/46
USPC ......... 320/107, 110, 114, 115, 116, 150, 153
See application file for complete search history.

(56) References Cited

U.S. PATENT DOCUMENTS

| | | | |
|---|---|---|---|
| 6,027,535 A | 2/2000 | Eberle et al. |
| 6,081,423 A | 6/2000 | Griffin |
| 6,188,202 B1 | 2/2001 | Yagi et al. |
| 6,204,639 B1 | 3/2001 | Takano et al. |
| 6,215,281 B1 | 4/2001 | Koch |
| 6,373,228 B1 | 4/2002 | Sakakibara |
| 6,566,005 B1 | 5/2003 | Shimma et al. |
| 6,597,572 B2 | 7/2003 | Nishikawa et al. |
| 6,636,016 B2 | 10/2003 | Tanaka et al. |
| 6,949,914 B2 | 9/2005 | Aradachi et al. |
| 6,967,464 B2 | 11/2005 | Heigl et al. |
| 7,116,554 B2 | 10/2006 | Lee et al. |
| 7,241,530 B2 | 7/2007 | Oogami |
| 7,326,490 B2 | 2/2008 | Moores, Jr. et al. |
| 7,355,851 B2 | 4/2008 | Lanni |
| 7,495,415 B2 | 2/2009 | Kanouda et al. |
| 7,504,804 B2 | 3/2009 | Johnson et al. |
| 7,557,542 B2 | 7/2009 | Bushong et al. |
| 7,692,408 B2 | 4/2010 | Miyazaki et al. |
| 7,733,054 B2 | 6/2010 | Phillips et al. |
| 7,800,901 B2 | 9/2010 | Borowy et al. |
| 7,843,691 B2 | 11/2010 | Reichert et al. |
| 7,846,577 B2 | 12/2010 | Kozu et al. |
| RE42,468 E | 6/2011 | Heigl et al. |
| 7,956,575 B2 | 6/2011 | Kawano et al. |
| 7,974,090 B2 | 7/2011 | Risher-Kelly |
| 8,203,307 B2 | 6/2012 | Zick et al. |
| 8,803,477 B2 | 8/2014 | Kittrell |
| 8,841,884 B2 | 9/2014 | Bourbeau et al. |
| 9,225,184 B2 | 12/2015 | Rief |
| 9,252,621 B2 | 2/2016 | Miyano |
| 9,306,251 B2 | 4/2016 | Inoue |
| 9,608,461 B2 | 3/2017 | Chen et al. |
| 9,620,827 B2 | 4/2017 | Touchin-Miller et al. |
| 9,634,503 B2 | 4/2017 | Taga et al. |
| 9,692,091 B2 | 6/2017 | Yamomoto et al. |
| 9,728,822 B2 | 8/2017 | Taga |
| 9,742,043 B2 | 8/2017 | Tanigaki et al. |
| 9,847,562 B2 | 12/2017 | Kondo |
| 9,917,452 B2 | 3/2018 | Kishima et al. |
| 10,090,498 B2 | 10/2018 | Olsson et al. |
| 10,103,558 B2 | 10/2018 | Teng et al. |
| 11,523,510 B2 * | 12/2022 | Silha ................ H02J 7/0045 |
| 2006/0266510 A1 | 11/2006 | Nobashi |
| 2007/0017230 A1 | 1/2007 | Pan |
| 2007/0139004 A1 | 6/2007 | Satsuma |
| 2007/0139887 A1 | 6/2007 | Lee et al. |
| 2008/0290836 A1 | 11/2008 | Tsai et al. |
| 2009/0021913 A1 | 1/2009 | Kuan |
| 2011/0014501 A1 | 1/2011 | Scheucher |
| 2011/0121783 A1 | 5/2011 | Boyles et al. |
| 2011/0279968 A1 | 11/2011 | Lin et al. |
| 2011/0300420 A1 | 12/2011 | Johnson, Jr. |
| 2013/0044002 A1 | 2/2013 | Schneider et al. |
| 2014/0139177 A1 | 5/2014 | Li |
| 2014/0340025 A1 | 11/2014 | Rief |
| 2014/0362522 A1 | 12/2014 | Degner et al. |
| 2014/0375269 A1 | 12/2014 | Ogura |
| 2015/0030717 A1 | 1/2015 | Gebert et al. |
| 2015/0077043 A1 | 3/2015 | Seidel et al. |
| 2015/0084591 A1 | 3/2015 | Kishima et al. |
| 2015/0155724 A1 | 6/2015 | Han et al. |
| 2015/0303717 A1 | 10/2015 | Schneider et al. |
| 2015/0340745 A1 | 11/2015 | Inoue |
| 2016/0226111 A1 | 8/2016 | Blume et al. |
| 2016/0285295 A1 | 9/2016 | Marinov et al. |
| 2016/0294025 A1 | 10/2016 | Choi et al. |
| 2016/0294203 A1 | 10/2016 | Teng et al. |
| 2017/0331302 A1 | 11/2017 | Namiki |
| 2017/0332517 A1 | 11/2017 | Gu et al. |
| 2018/0090957 A1 | 3/2018 | Rao |
| 2018/0130980 A1 | 5/2018 | Ogura et al. |
| 2018/0191183 A1 | 7/2018 | Namiki |
| 2018/0376625 A1 | 12/2018 | Truettner et al. |
| 2019/0027949 A1 | 1/2019 | Critelli |
| 2019/0075665 A1 | 3/2019 | Choski et al. |
| 2020/0037474 A1 | 1/2020 | Silha et al. |
| 2020/0128672 A1 | 4/2020 | Silha et al. |

FOREIGN PATENT DOCUMENTS

| | | |
|---|---|---|
| CN | 205178582 U | 4/2016 |
| CN | 205693381 U | 11/2016 |
| CN | 206041584 U | 3/2017 |
| CN | 106941271 A | 7/2017 |
| DE | 102007042399 A1 | 3/2009 |
| EP | 0332475 A2 | 9/1989 |
| EP | 2221939 A2 | 8/2010 |
| EP | 1580863 B1 | 11/2016 |
| EP | 3229337 A1 | 10/2017 |
| EP | 3379688 A1 | 9/2018 |
| GB | 2449444 A | 11/2008 |
| JP | 2006330913 A | 12/2006 |
| JP | 2014038935 A | 2/2014 |
| JP | 5620771 B2 | 11/2014 |
| JP | 2012074161 A | 11/2014 |
| WO | 2005117231 A1 | 12/2005 |
| WO | 2009033865 A1 | 3/2009 |
| WO | 2013027599 A1 | 2/2013 |
| WO | 2015075914 A1 | 5/2015 |
| WO | 2017002519 A1 | 1/2017 |
| WO | 2017083405 A1 | 5/2017 |
| WO | 2017208710 A1 | 12/2017 |

* cited by examiner

BATTERY CHARGER INCLUDING AN ISOLATING MEMBER

RELATED APPLICATIONS

This application is a continuation of U.S. patent application Ser. No. 16/655,684, filed Oct. 17, 2019, now U.S. Pat. No. 11,523,510, which claims priority to Chinese Patent Application No. 201821688208.7, filed Oct. 17, 2018, the entire content of each of which is hereby incorporated by reference.

TECHNICAL FIELD

The present utility model relates to battery chargers and, more particularly, to cooling a battery charger.

BACKGROUND

A typical battery charger includes a battery charging circuit which is connectable to a power source and to a rechargeable battery and which is operable to charge the battery.

SUMMARY

In one independent embodiment, a battery charger may generally include a housing defining an air inlet and an air outlet; charger electronics positioned within the housing; a tubular heat sink operable to dissipate heat in the charger; a fan operable to cause air flow from the inlet to the outlet and along the heat sink; and a diverter integral with and extending within the housing, the diverter being configured to facilitate the air flow from the air inlet to the air outlet.

The diverter may be configured to create turbulent air flow within the housing. In some constructions, the diverter extends from a top of the housing. The housing may include a diverter extending from a bottom of the housing, the diverter being configured to direct air along a bottom of and/or through the charger electronics. The fan may be between an end of the heat sink and the air outlet. A baffle may be connected between the end of the heat sink and the fan.

In another independent embodiment, a battery charger may generally include a housing defining an air inlet positioned on a first side of the housing and an air outlet positioned on an opposite second side of the housing; charger electronics positioned within the housing; a tubular heat sink operable to dissipate heat in the charger; and a fan operable to cause air flow from the inlet to the outlet and along the heat sink.

In some constructions, the first side may be a front of the housing, and the second side may be a back of the housing such that the second side may be opposite the first side. The first side may be a front of the housing, and the second side may be adjacent and oriented about 90 degrees relative to the first side. The air inlet may be positioned proximate a battery couplable to the charger; however, air flow may not enter or exit the battery before or after flowing through the housing of the charger.

The battery charger may further include a second air inlet positioned on a third side of the housing. The third air inlet may be configured to direct air flow along a bottom of the charger electronics. The charger electronics may include a second heat sink for dissipating heat from components of the charger electronics to the bottom of the charger electronics.

The tubular heat sink may include a slot for directing the air flow from the heat sink over a component of the charger electronics.

In yet another independent embodiment, a battery charger may generally include a housing having support structure for supporting at least two different types of batteries for charging; charger electronics operable to output a charging current to charge a supported battery; and a fan operable to cause air flow through the housing. A fan speed may be adjusted based on a temperature of the charger regardless if one of the batteries is coupled to the charger.

In a further independent embodiment, a battery charger may generally include a housing having support structure for supporting different types of batteries for charging; charger electronics operable to output a charging current to charge a supported battery; and an indictor positioned on the housing and operable to indicate an operation of the charger, the indicator including a light pipe for illuminating the indicator.

In another independent aspect, a battery charger may generally include a housing including a support portion connectable to and operable to support a battery pack, the support portion defining a channel operable to receive a projection on the battery pack, the support portion including a plastic material molded to define the channel, and a metal material molded in the plastic material, the metal material defining a C-shaped portion around the channel; a charging circuit supported by the housing; and a charger terminal electrically connected to the charging circuit and connectable to a terminal of the battery pack.

In yet another independent aspect, a battery charger may generally include a housing including a support portion operable to support a battery pack for charging; charging circuitry operable to supply current to charge the battery pack; a printed circuit board (PCB) supported by the housing, the PCB having a first portion supporting alternating current (AC) electrical components and a second portion supporting direct current (DC) electrical components; an indicator supported on the housing and associated with the support portion, the indicator including a light-emitting diode (LED) supported on the first portion of the PCB and operable to emit light; and an isolator positioned between the LED and the AC components (e.g., positioned on the PCB between the LED and the AC components, extending through a slot in the PCB to be positioned between the LED and the AC components, etc.).

In a further independent aspect, a battery charger may generally include a housing including a support portion operable to support a battery pack for charging; charging circuitry operable to supply current to charge the battery pack; a PCB supported by the housing, the PCB having a first portion supporting AC components and a second portion supporting DC components, a trace on the PCB being electrically connected to the second portion of the PCB, the trace extending from the second portion and along the first portion; and an indicator supported on the housing and associated with the support portion, the indicator including a LED supported on the first portion of the PCB and operable to emit light, the LED being electrically connected to and receiving DC power through the trace, the LED being selectively positioned along a length of the trace.

Other independent aspects of the utility model will become apparent by consideration of the detailed description and accompanying drawings.

DETAILED DESCRIPTION

Figure 1:
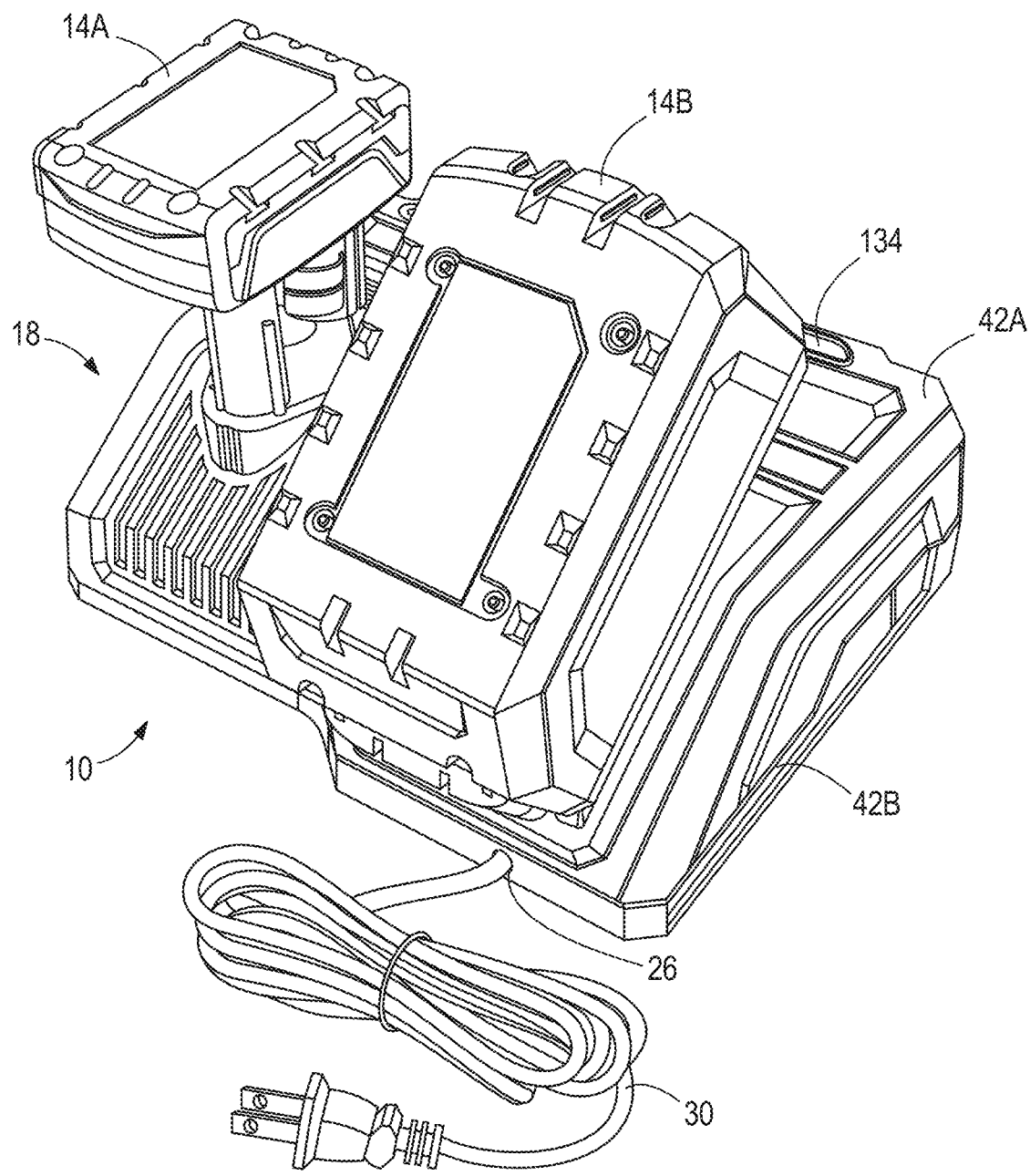
FIG. 1 is a perspective view of a battery charger supporting different types of batteries for charging.

Before any independent embodiments of the utility model are explained in detail, it is to be understood that the utility model is not limited in its application to the details of construction and the arrangement of components set forth in the following description or illustrated in the following drawings. The utility model is capable of other independent embodiments and of being practiced or of being carried out in various ways.

Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof.

Relative terminology, such as, for example, "about", "approximately", "substantially", etc., used in connection with a quantity or condition would be understood by those of ordinary skill to be inclusive of the stated value and has the meaning dictated by the context (for example, the term includes at least the degree of error associated with the measurement of, tolerances (e.g., manufacturing, assembly, use, etc.) associated with the particular value, etc.). Such terminology should also be considered as disclosing the range defined by the absolute values of the two endpoints. For example, the expression "from about 2 to about 4" also discloses the range "from 2 to 4". The relative terminology may refer to plus or minus a percentage (e.g., 1%, 5%, 10% or more) of an indicated value.

Also, the functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way but may also be configured in ways that are not listed.

Furthermore, some embodiments described herein may include one or more electronic processors configured to perform the described functionality by executing instructions stored in non-transitory, computer-readable medium. Similarly, embodiments described herein may be implemented as non-transitory, computer-readable medium storing instructions executable by one or more electronic processors to perform the described functionality. As used in the present application, "non-transitory computer-readable medium" comprises all computer-readable media but does not consist of a transitory, propagating signal. Accordingly, non-transitory computer-readable medium may include, for example, a hard disk, a CD-ROM, an optical storage device, a magnetic storage device, a ROM (Read Only Memory), a RAM (Random Access Memory), register memory, a processor cache, or any combination thereof.

Many of the modules and logical structures described are capable of being implemented in software executed by a microprocessor or a similar device or of being implemented in hardware using a variety of components including, for example, application specific integrated circuits ("ASICs"). Terms like "controller" and "module" may include or refer to both hardware and/or software. Capitalized terms conform to common practices and help correlate the description with the coding examples, equations, and/or drawings. However, no specific meaning is implied or should be inferred simply due to the use of capitalization. Thus, the claims should not be limited to the specific examples or terminology or to any specific hardware or software implementation or combination of software or hardware.

FIG. 1 illustrates a battery charger 10 operable to charge a battery 14A, 14B coupled to the charger 10. In the illustrated construction, the battery charger 10 is operable to charge a first battery 14A of a first type and a second battery 14B of a second type. The illustrated battery charger 10 may be operable to charge a high output battery (e.g., having a current capacity of 12 amp-hours (Ah) or more), which requires about 3 times the power of typical chargers, in about 60 minutes.

The battery type may be defined by nominal voltage, current capacity, connection configuration (e.g., "tower" vs. "slide-on"), etc., of the battery 14A, 14B. For example, the first battery 14A may include a high-power battery pack with a nominal voltage of about 12 volts (V) and having a tower-style configuration, and the second battery 14A may include a high-power battery pack with a nominal voltage of 18V and a slide-on configuration. In other constructions (not shown), the batteries 14A, 14B may be the same type of battery.

Each battery 14A, 14B is connectable to and operable to power various motorized power tools (e.g., a cut-off saw, a miter saw, a table saw, a core drill, an auger, a breaker, a demolition hammer, a compactor, a vibrator, a compressor, a drain cleaner, a welder, a cable tugger, a pump, etc.), outdoor tools (e.g., a chain saw, a string trimmer, a hedge trimmer, a blower, a lawn mower, etc.), other motorized devices (e.g., vehicles, utility carts, a material handling cart, etc.), and non-motorized electrical devices (e.g., a power supply, a light, an AC/DC adapter, a generator, etc.).

Figure 9:
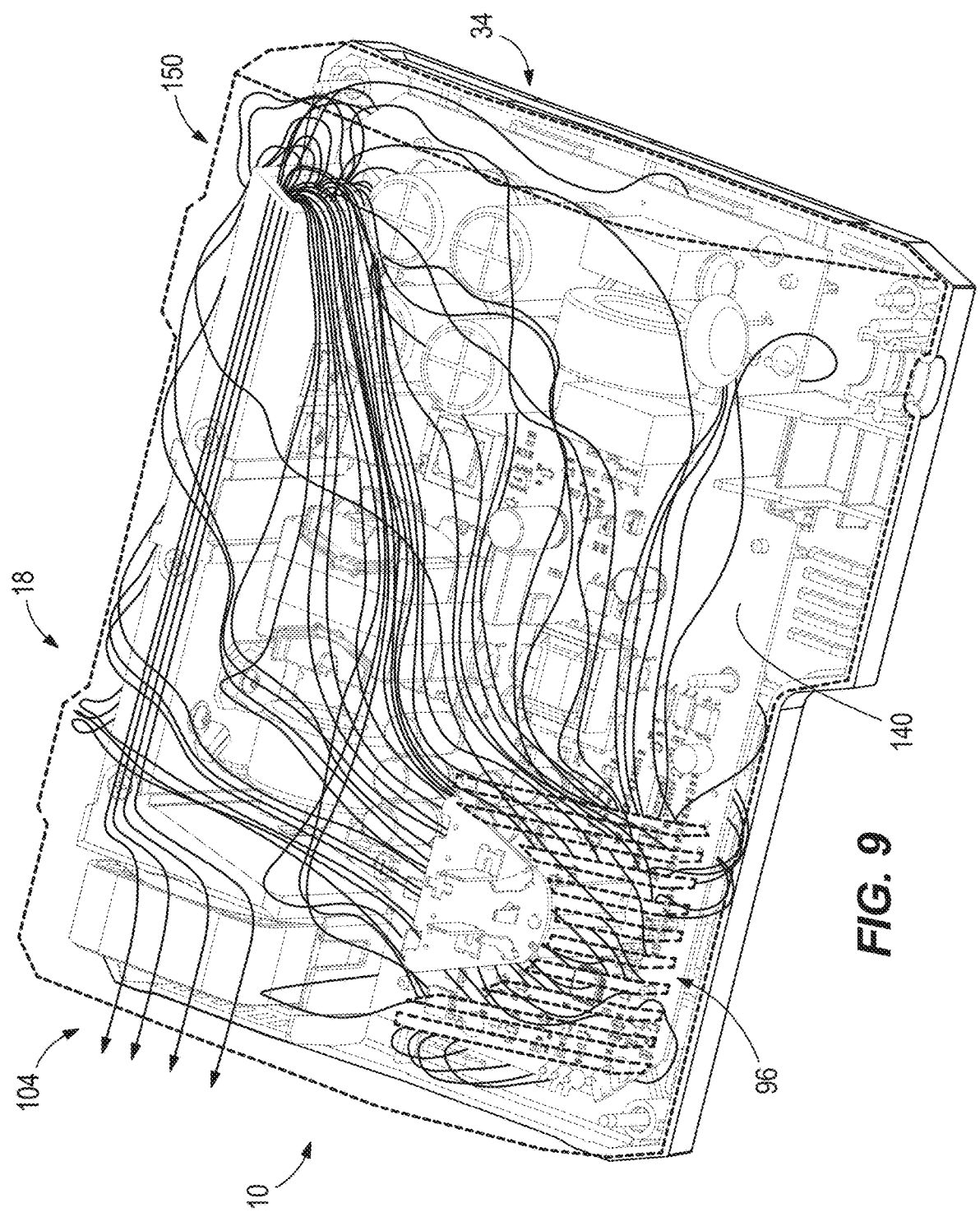
FIG. 9 is a top perspective view of the charger of FIG. 2, with portions of the housing shown as transparent and illustrating an airflow pattern through the housing.

The charger 10 includes a housing 18 providing support structure 22A, 22B (FIG. 2) engageable with the respective batteries 14A, 14B, a power input port 26 for connection to a power supply (e.g., through a power cord 30), charger electronics 34 (FIG. 6), and a heat dissipating structure 38. Air flow (e.g., green lines; FIG. 9) is configured to flow though the housing 18 for dissipating heat generated by the charger 10.

Figure 2:
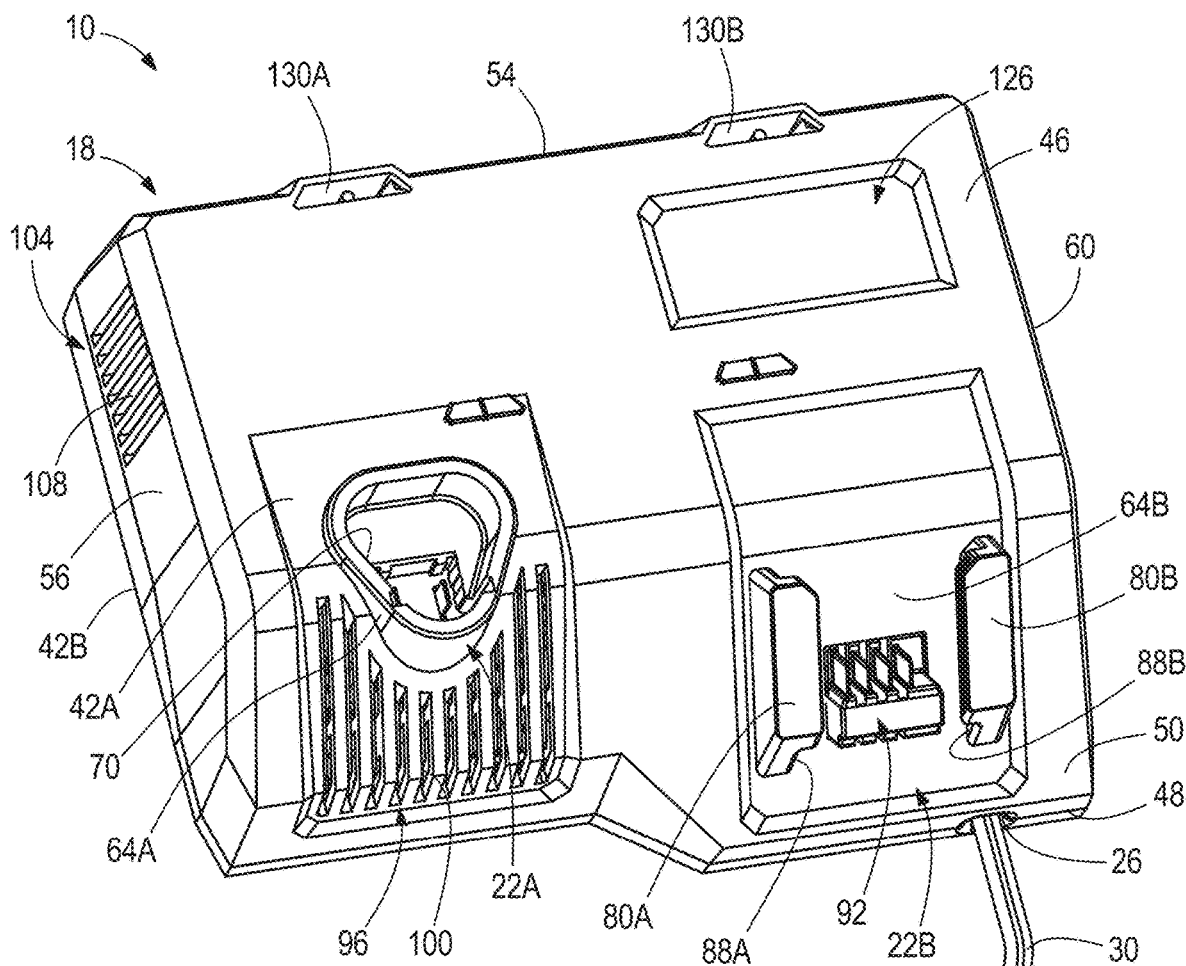
FIG. 2 is a perspective view of an alternative construction of a battery charger for charging different types of batteries.

With reference to FIG. 2, the charger housing 18 has a top portion 42A and an opposite bottom portion 42B coupled to the top portion 42A (e.g., by fasteners (not shown)). The housing portions 42A, 42B may be formed of plastic with each molded as a single piece.

The top portion 42A has a top wall 46, a lower wall 48, and an inclined wall 50 coupled between the walls 46, 48. The top wall 46 is spaced from the bottom portion 42B, and the lower wall 48 is substantially perpendicular to the bottom portion 42B. The top wall 46 provides the top of the housing 18, and the bottom portion 42B provides a bottom of the housing 18 opposite the top. The inclined wall 50 and the lower wall 48 provide a front of the housing 18. The top portion 42A further includes a back wall 54 opposite the front and opposite side walls 56, 60. The bottom portion 42B has a raised wall 62 interfacing with one or more walls (e.g., the back wall 54, the side walls 56, 60, etc.) of the portion 42A.

The housing 18 provides the battery support structure 22A, 22B. Each support structure 22A, 22B is at least partially positioned substantially on the front of the housing (e.g., on the inclined wall 50) and defines adjacent supporting sections 64A, 64B. The supporting sections 64A, 64B are configured to support the batteries 14A, 14B, respectively.

The illustrated supporting section 64A defines a recess 70, as a battery receiving port, defined by the top wall 46 and the inclined wall 50. The recess 70 is configured to receive at least a portion (e.g., the tower) of the battery 14A. A first set of charger terminals 74 (FIG. 6) extend from within the housing 18 through holes into the recess 70. The charger terminals 74 are configured to electrically connect to battery terminals of the battery 14A received in the recess 70 for charging.

The illustrated supporting section 64B includes rail members 80A, 80B and a charger terminal block 84. The rail members 80A, 80B are spaced apart, substantially parallel and positioned on the inclined wall 50. A groove 88A, 88B is defined between the inclined wall 50 and the associated rail member 88A, 88B. The rail members 80A, 80B and grooves 88A, 88B are engageable with corresponding structure on the battery 14B. The charger terminal block 84 is positioned between the rail members 80A, 80B and includes a second set of charger terminals 92 configured to electrically connect to battery terminals of the battery 14A for charging.

Figure 10A:
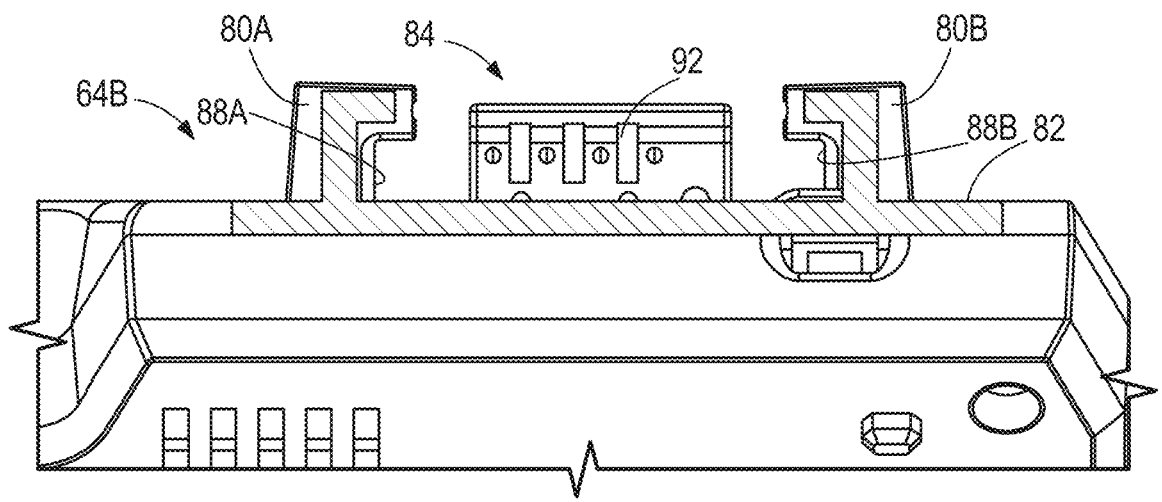
FIG. 10A is a cross-sectional view of a portion of the charger of FIG. 2.
Figure 10B:
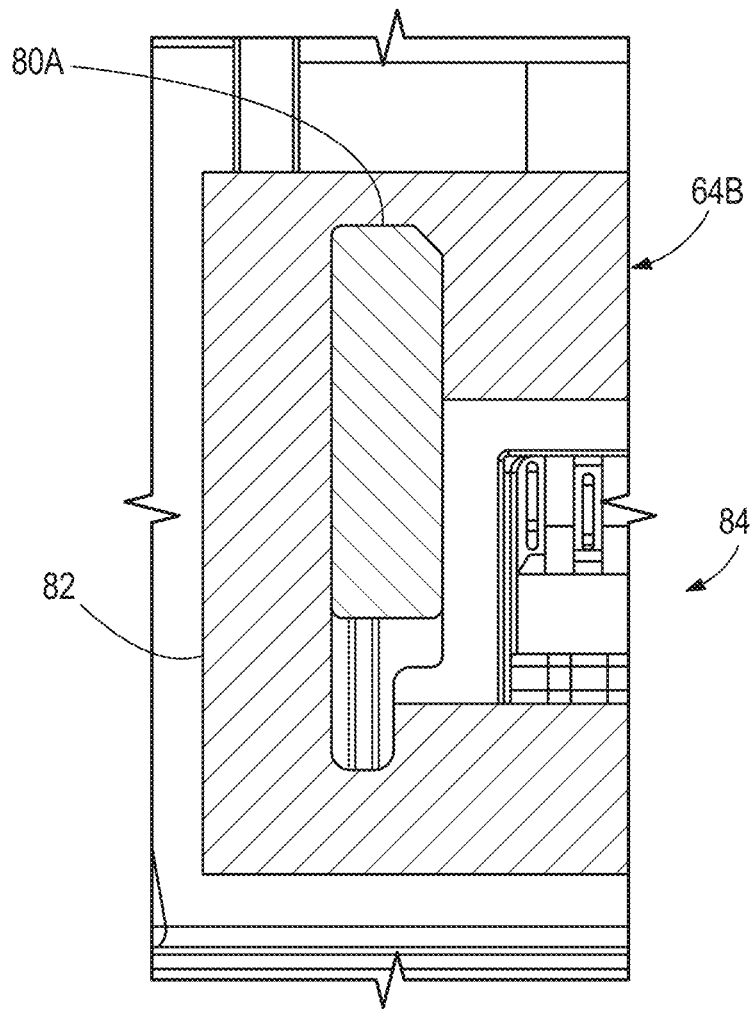
FIG. 10B is a top view of the portion of the charger shown in FIG. 10B.

In some embodiments (see FIGS. 10A-10B), the rail members 80A, 80B include a reinforcement member 82. The illustrated reinforcement member 82 (e.g., green member) is molded as a part of the housing 18 with the rail members 80A, 80B and with the supporting section 64B. The illustrated reinforcement member 82 is formed as a single piece of reinforcing material, such as metal (e.g., a metal stamping), hard plastic, etc. In other embodiments (not shown), the reinforcement member 82 is formed by two or more pieces coupled together.

Figure 3:
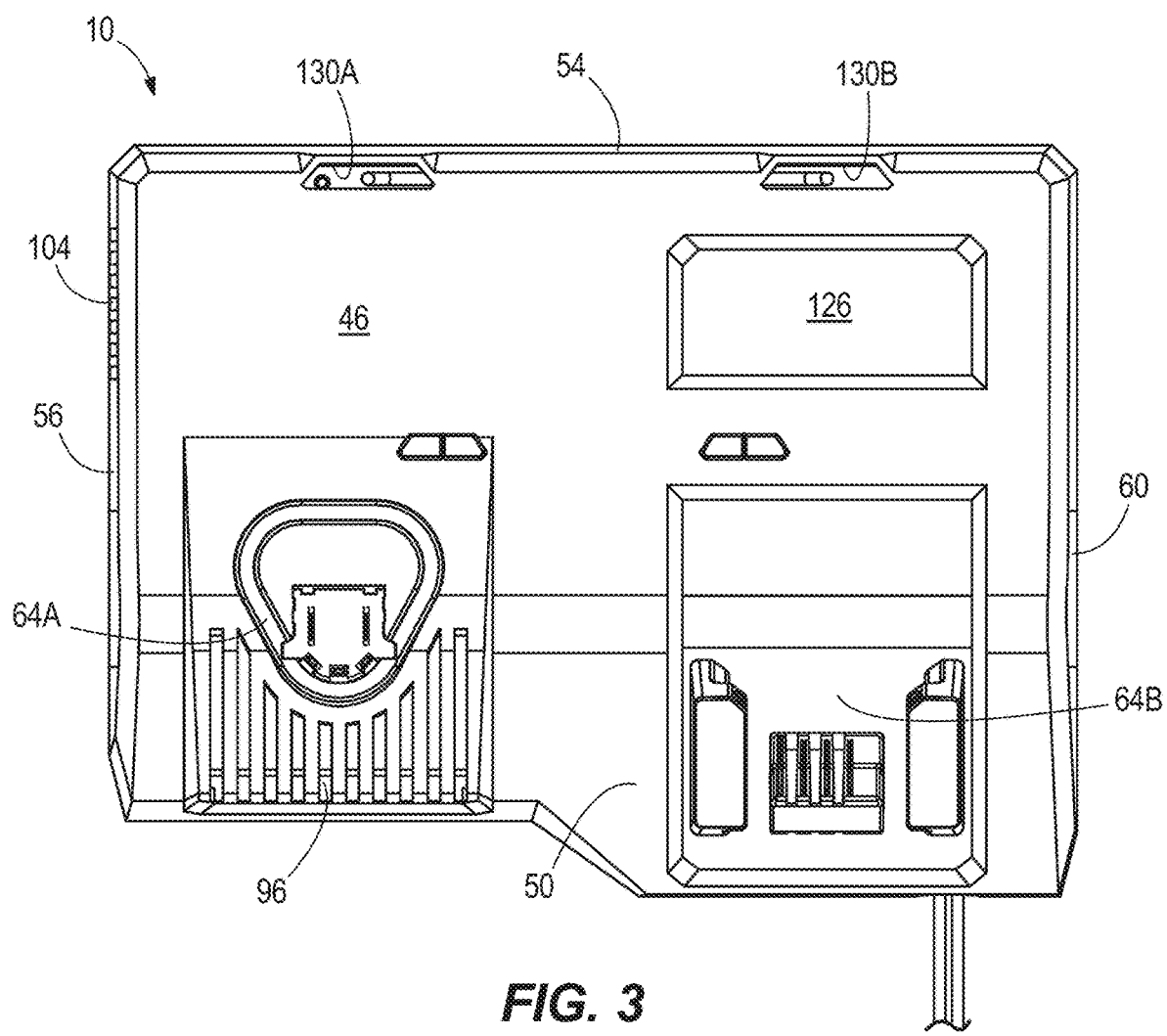
FIG. 3 is a top view of the charger of FIG. 2.
Figure 4:
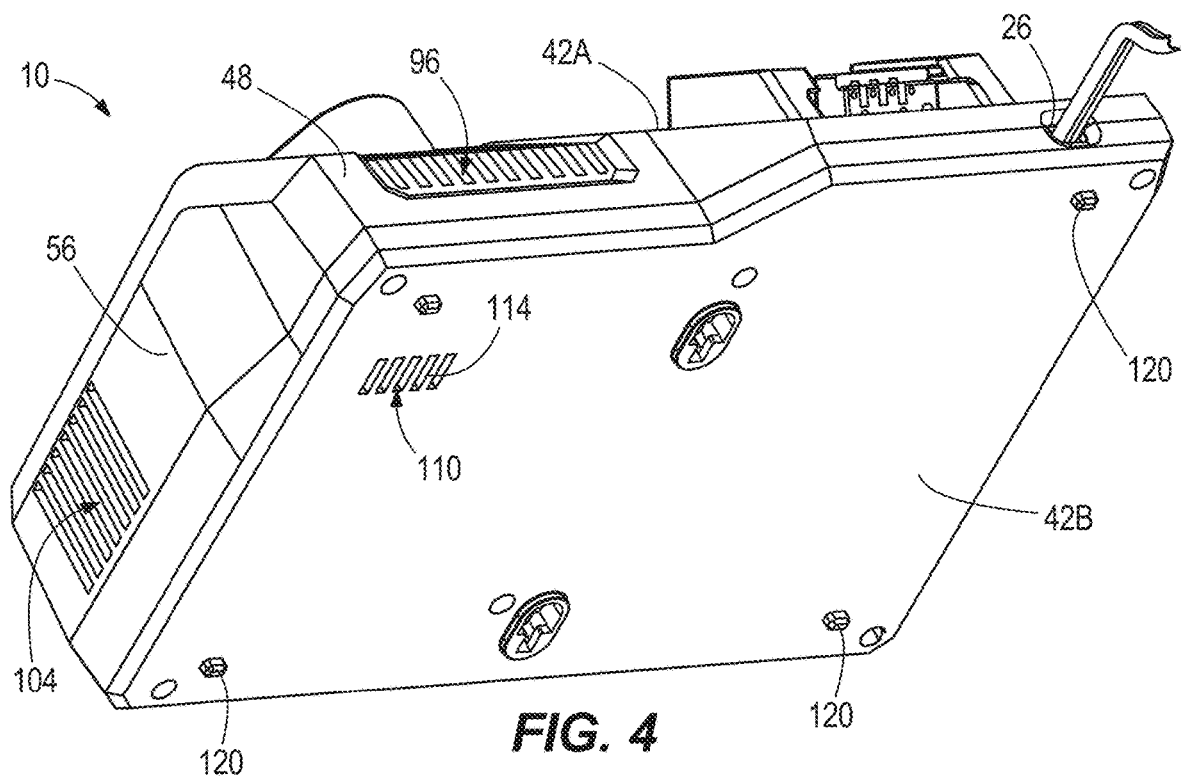
FIG. 4 is a bottom perspective of the charger of FIG. 2.

With reference to FIGS. 2-4, the housing 18 defines an air inlet 96 in the inclined wall 50 and positioned below the first supporting section 64A (e.g., the recess 70). As such, the illustrated air inlet 96 is below the battery 14A when coupled to the charger 10. In addition, the illustrated inlet 96 is positioned on the front of the housing 18 and includes slots 100 (e.g., longitudinal slots) defined in the inclined wall 50 and, partially, by the lower wall 48. The illustrated slots 100 extend through the inclined wall 50 into the interior of the housing 18. The slots 100 extend from proximate the top wall 46 to the lower wall 48. In other embodiments (not shown), the slots 100 may extend in a latitudinal direction, a combination longitudinal/latitudinal direction, etc. The slots 100 are configured to facilitate air flow into the housing 18.

The housing 18 also defines an air outlet 104 positioned on the side 56 of the housing 18 and proximate the back 54. The outlet 104 includes slots 108 (e.g., longitudinal slots) defined by the side 56 and extending from proximate the bottom portion 42B to proximate the top portion 42A (e.g., the top wall 46). In other embodiments (not shown), the slots 108 may extend in a latitudinal direction, a combination longitudinal/latitudinal direction, etc. The slots 108 are configured to facilitate air flow exiting the housing 18. The inlet 96 and the outlet 104 are positioned on different locations of the housing 18 (e.g., as illustrated, the outlet 104 is positioned on the side 56 oriented at 90 degrees relative to the front of the housing 18).

The housing 18 may include more than one inlet and/or outlet. For example, as shown in FIG. 4, the housing 18 further defines a second air inlet 110 (FIG. 4) positioned on the bottom. The illustrated second air inlet 110 is defined by the bottom portion 42B. The second air inlet 110 includes slots 114 proximate the front (e.g., the lower wall 48) and the side 56 of the housing 18. The second air inlet 110 may facilitate air flow to a bottom side 118 (FIG. 6) of the charger electronics 34, as further discussed below.

It should be understood that, in other constructions (not shown), the first inlet 96, the second inlet 110, and/or the outlet 104 may be positioned on any side of the housing 18 (e.g., the back 54, the other side 60, the bottom, etc.).

The slots 100, 108, 114 may have the same or different lengths. For example, the illustrated slots 100 of the first inlet 96 have different lengths. The illustrated slots 114, 108 of each of the second inlet 110 and the outlet 104, respectively, have the same length. Furthermore, the slots 100, 108, 114 may have any shape, such as, rectangular, triangular, trapezoidal, etc. For example, FIG. 3 illustrates the inlet 96 formed by rectangular and trapezoidal slots, while FIG. 4 illustrates the outlet 104 being formed by generally rectangular slots.

With reference to FIG. 4, feet members 120 extend from and are configured to position the bottom portion 42B of the housing 18 at a distance (e.g., three millimeters (3 mm)) from a work surface (e.g., a table). Furthermore, the feet members 120 are configured to facilitate air flow to the second inlet 110. The illustrated feet members 120 include an elastomeric material and to improve support (e.g., frictional, vibrational, etc.) of the charger 10 on the work surface.

With reference to FIGS. 2-3, the top portion 42A includes an indicia region 126 in which logos, images, brands, text, marks, etc., are displayed. The illustrated indicia region 126 is positioned on the top wall 46 and above the second supporting section 64B. The housing 18 may include one or more indicia regions positioned on any of the sides (e.g., top, bottom, back 54, etc.). Furthermore, the top wall 46 may include another indicia region above the first supporting section 64A.

The top portion 42A includes a plurality of openings 130 (e.g., two openings 130A, 130B) defined by the top wall 46 and positioned proximate the back 54 of the housing 18. One opening 130A is positioned opposite the first supporting section 64A, and the other opening 130B is positioned opposite the second supporting section 64B. The openings 130A, 130B may be configured to receive a lens 134 (only one of which is shown in FIG. 1). A light source (e.g., a light-emitting diode (LED)) may be provided within the housing 18 to illuminate the lens 134. As such, the openings 130A, 130B and the lens 134 are configured to form indicators on the top portion 42A. Each supporting section 64A, 64B has an indicator for indicating an operation (e.g., charging) of the charger 10.

The illustrated power input port 26 is positioned on the front of the housing 18, and below the second supporting section 64B (FIG. 2). More specifically, the power input port 26 is defined in the lower wall 48. In other embodiments (not shown), the power input port 26 may be located on any side (e.g., back 54, bottom, etc. of the housing 18). The illustrated power cord 30 extends from the charger electronics 34 within the housing 18 (FIG. 6) through the power input port 26 to the power source.

Figure 6:
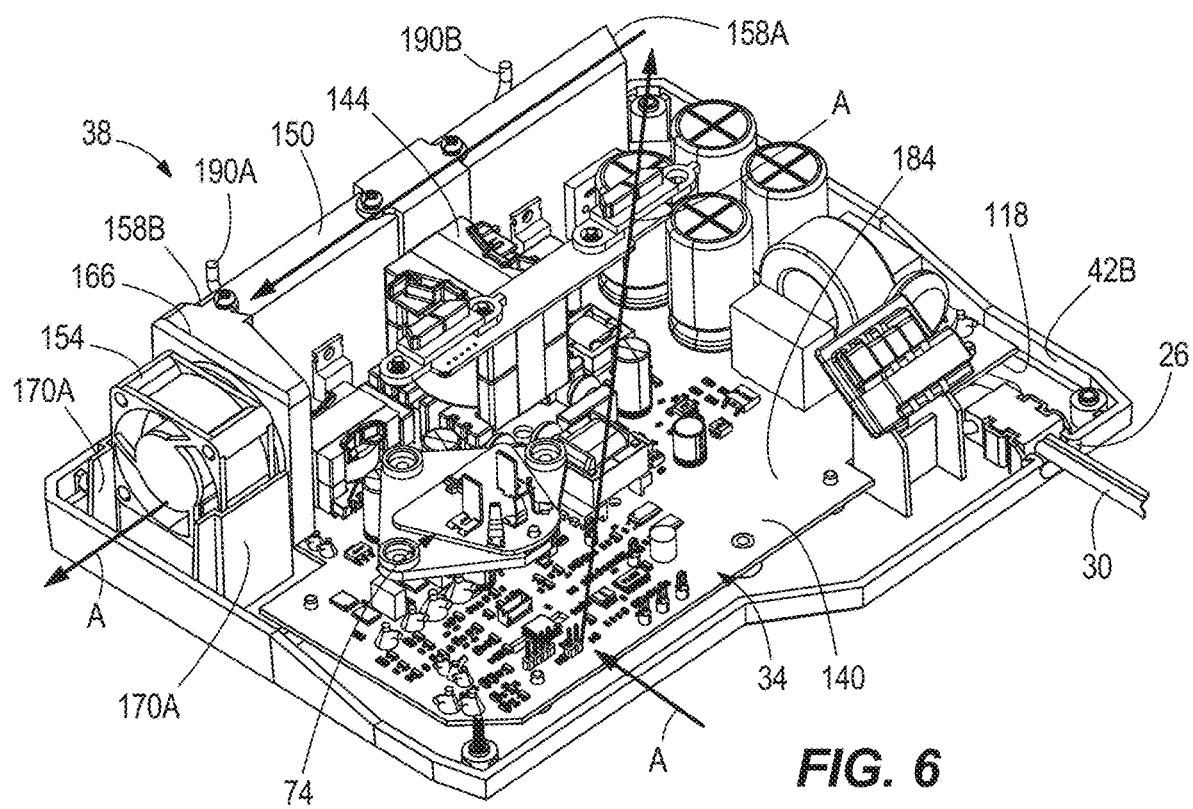
FIG. 6 is a top perspective view of the charger of FIG. 2, with portions of the housing removed and illustrating a circuit board.
Figure 7:
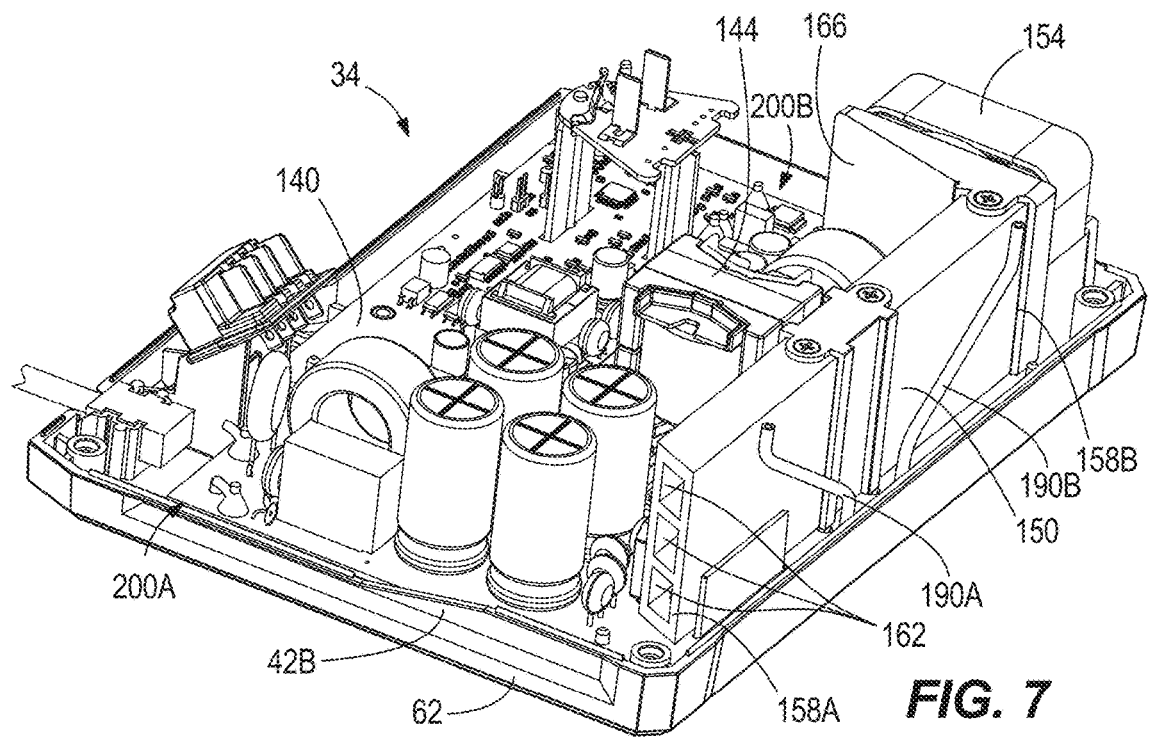
FIG. 7 is another top perspective view of the charger of FIG. 2, with portions of the housing removed.

With reference to FIGS. 6-7, the charger electronics 34 are supported by the bottom portion 42B. The charger electronics 34 are operable to output a charging current to one or both of the batteries 14A, 14B to charge the batteries 14A, 14B. The charger electronics 34 include, among other things, a printed circuit board (PCB) 140, a charger microcontroller (not shown), and a transformer 144. The charger electronics 34 may include a charging circuit portion (not shown; e.g., on separate PCBs) for each of the batteries 14A, 14B so that each battery 14A, 14B may be charged simultaneously and independently. The charging current provided to each battery 14A, 14B may be the same or different.

The charger 10 further includes a heat sink 150 and a fan 154 within the housing 18 to provide the heat dissipating structure 38. A temperature sensor (not shown) is disposed in the housing 18 and positioned near the charger electronics 34 (e.g., near the component(s) generating the most heat (e.g., the CPU, the transformer 144, field effect transistors (FETs), etc.)) or the heat sink 150. In the illustrated embodiment, the temperature sensor is positioned proximate a side of the heat sink 150.

In the illustrated construction, the heat sink 150 is disposed in the housing 18 proximate the back 54. In other constructions (not shown), the heat sink 150 may be positioned at other locations in the housing 18 (e.g., proximate the front, the sides 56, 60, etc.). The heat sink 150 is in heat transfer relationship with components of the charger electronics 34 (e.g., is mounted onto and in contact with the PCB 140). In other words, heat transfers from the heat-generating components of the charger 10 to the heat sink 150 through conduction.

In the illustrated embodiment, the heat sink 150 is formed of heat-conducting material, such as, for example, aluminum, and extends between opposite ends 158A, 158B. Furthermore, the illustrated heat sink 150 is constructed of one or more hollow tubes 162 (three are shown in FIG. 7), each having a rectangular shape and stacked above one another. The tubes 162 extend between the opposite ends 158A, 158B. As such, the illustrated heat sink 150 forms a tubular heat sink.

In other constructions (not shown), the hollow tube(s) 162 may have another shape, such as, for example, triangular, cylindrical, etc., and the heat sink 150 may have any number of tubes 162 (e.g., one, two, more than three). The charger 10 may include more than one heat sink 150.

The first end 158A forms an inlet of each tube 162 for air flow to enter the heat sink 150, and the second end 158B forms an outlet of each tube 162 for air flow to exit the heat sink 150. As shown in FIG. 7, the inlet of each tube 162 is angled toward the front of the housing 18.

The illustrated fan 154 is positioned between the second end 158B of the heat sink 150 and the outlet 104. A baffle 166 extends between the second end 158B and the fan 154 for directing air flow from the heat sink 150 to the outlet 104. Projections 170A, 170B extend from the top portion 42A (FIG. 5) and the bottom portion 42B (FIG. 6). The fan 154 is positioned between (i.e., sandwiched between) the projections 170A, 170B to be secured within the housing 18.

The illustrated fan 154 is a multi-speed fan operable to rotate at more than one speed and directs air flow from the inlet 96 through the housing 18 and to the outlet 104. The speed at which the fan 154 rotates may be determined based on a temperature of one or more of the charger electronics 34, the heat sink 150, a supported battery 14A, 14B, etc. The temperature sensor (not shown) is configured to measure the temperature and transmit a signal output to the microcontroller for determining the temperature of the charger 10. Subsequently, the microcontroller controls the speed of the fan 154 based on the temperature (e.g., of the heat sink 150, as illustrated). In some embodiments, at full speed, the fan 154 generates an air flow of between about 13.6 m$^3$/hour and about 25.5 m$^3$/hour. Still further, in some embodiments, the fan 154 may generate an air flow of about 20.4 cubic feet per minute (CFM) and up to about 35 m$^3$/hour or less.

Figure 5:
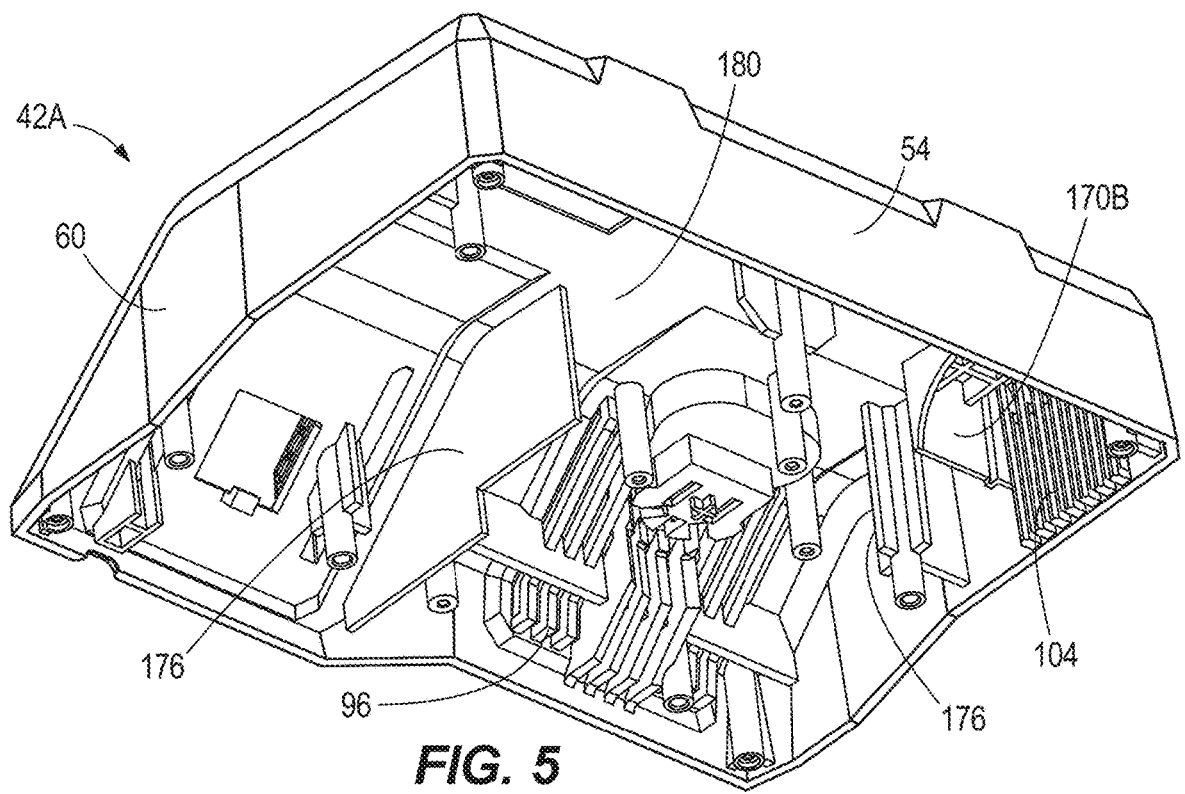
FIG. 5 is a bottom perspective view of a portion of a housing of the charger of FIG. 2.

With reference to FIG. 5, the top portion 42A of the housing 18 includes a plurality of wall members 176 extending from an inner surface 180. The wall members 176 are integral with the top portion 42A and are configured to form a fluid diverter within the housing 18. The diverter may direct air (FIG. 6) from the inlet 96 over the charger electronics 34 (e.g., the PCB 140) to the heat sink 150. Furthermore, the diverter is configured to create turbulent fluid flow and may, therefore, increase air flow through the housing 18 and/or facilitate dissipation of heat from the housing 18. The bottom portion 42B may also include similar integral wall members or diverters for further directing air flow through the housing 18. The wall members 176 may further extend through the PCB 140 for directing air flow through the PCB 140 and through the housing 18.

As shown in FIG. 6, the charger 10 defines a flow path A through the housing 18. In the illustrated embodiment, air flows along the flow path A from the inlet 96, over the charger electronics 34 (e.g., the PCB 140) to the inlet of the heat sink 150, and through the heat sink 150 to the outlet 104. The fan 154 directs air flow along the flow path A. Furthermore, the fan 154 directs air flow into the inlet and out of the outlet of each tube 162. The air flow operates to dissipate heat generated by the charger electronics 34 from the housing 18. In other embodiments (not shown), the fan 154 may be operated in reverse such that the flow path A through the housing 18 is reversed.

In one example (see FIG. 9 in which the housing 18 and the heat sink 150 are shown as transparent to illustrate the air flow), air (e.g., green lines) flows from the inlet 96 to the outlet 104 through the housing 18. Specifically, air flows from the inlet 96, over the charger electronics 34, and through the heat sink 150 to the outlet 104. The inlet 96, the heat sink 150, and the outlet 104 are positioned to direct the air along this flow path for dissipating the heat generated by the charger 10.

The charger 10 may further define a second flow path in fluid communication with the second inlet 110. Specifically, air flows into the bottom of the housing 18 through the second inlet 110 and past components of the charger electronics 34 positioned on the bottom side 118 of the PCB 140.

Air flow in the second flow path may be combined with air flow in the first flow path from the first inlet 96 to exit the outlet 104. As such, air flow within the housing 18 may be separated along at least a portion of the flow paths through the housing 18.

The PCB 140 may further include a heat sink or copper (not shown) extending from a top side 184 through the PCB 140 to the bottom side 118 to dissipate heat generated by any of the components of the charger electronics 34 to the bottom side 118. Air entering the housing 18 through the second inlet 110 is configured to flow past the bottom side 118 to further facilitate dissipation of heat of the charger electronics 34 from the housing 18.

The heat sink 150 may include a slot (not shown) proximate one or some of the components of the charger electronics 34, such as, for example, the transformer 144. The slot may be configured to direct a portion of air flowing through the heat sink 150 over a specific component (e.g., the transformer 144) on the PCB 140. As such, air may flow at least partially through the heat sink 150 more than once.

With reference to FIGS. 6-7, the charger 10 includes a plurality of light pipes 190 (e.g., two light pipes 190A, 190B), each extending to an opening 130A, 130B defined by the top portion 42A. Each light pipe 190A, 190B directs light from an associated light source to each indicator. In one embodiment, a number (e.g., two shown) of light emitting diodes (LEDs) are positioned on and electrically connected to the PCB 140. Each LED emits light, and the associated light pipe 190A, 190B is configured to direct the light to the indicator on the top portion 42A of the housing 18. The light pipes 190A, 190B are in heat transfer relationship ((e.g., mounted onto and in contact) with the heat sink 150 for transferring heat generated by the light pipes 190A, 190B to the heat sink 150.

The light pipes 190A, 190B (i.e., the respective LEDs) are electrically connected to the charger electronics 34 for controlling illumination of the light pipes 190A, 190B. For example, the indicator of the first supporting section 64A (i.e., the light pipe 190A) may be operated when the first battery 14A is electrically connected to the charger terminals 74 of the first supporting section 64A. As such, the indicators may be configured to indicate to a user when the respective batteries 14A, 14B are connected and charging.

In operation, one or both of the batteries 14A, 14B are coupled to the respective battery support structure 22A, 22B (e.g., the supporting sections 64A, 64B) for charging. The first set of terminals 74 electrically connect with the battery terminals of the first battery 14A, and/or the second set of terminals 92 electrically connect with the battery terminals of the second battery 14B. The charger 10 supplies charging current to the first and/or second battery 14A, 14B. Each indicator indicates to the user the charging operation for the associated battery 14A, 14B (e.g., completion of charging (i.e., when the charging current is zero Amps (0 A)).

Figure 8:
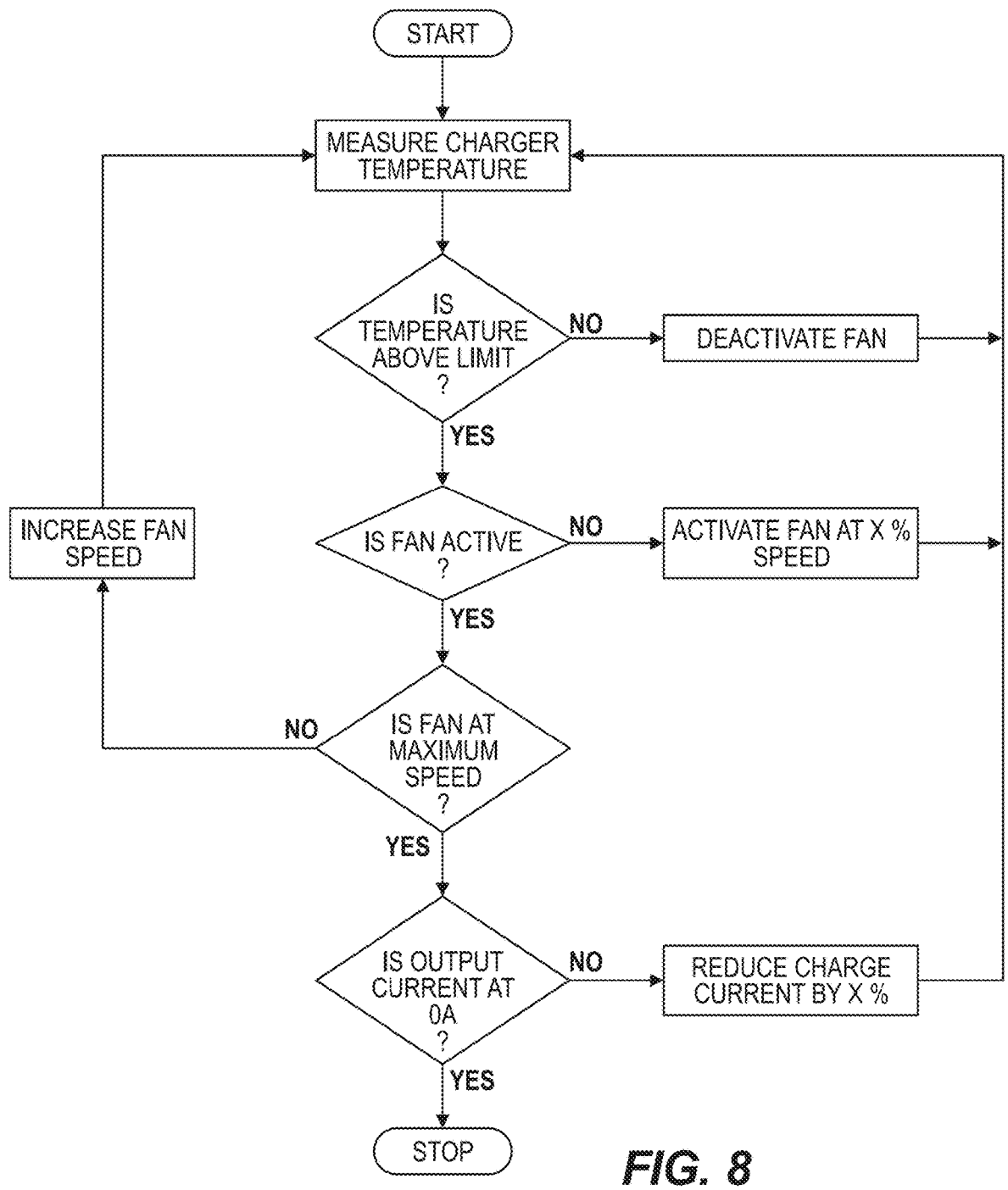
FIG. 8 is a flow chart illustrating a method of operating the charger of FIG. 2.

As mentioned above, in the illustrated construction, the fan 154 is a multi-speed fan. With reference to FIG. 8, the microcontroller determines the charger temperature (e.g., of the heat sink(s) 150, the charger electronics 34, etc.) and, when the temperature reaches or exceeds a threshold, activates the fan 154 to operate at a corresponding fan speed. For example, if the microcontroller detects a temperature of X ° C. (e.g., about 50% maximum operating temperature), then the fan 154 is activated at X % speed (e.g., about 50% speed). It should be understood that, in other embodiments, the fan 154 may be activated at a different speed (e.g., more than 50% (100%, 75%, etc.) or less than 50% (25%, 10%, etc.)). Also, the speed of the fan 154 may be based on the sensed temperature (e.g., higher for a higher temperature or lower for a lower temperature) and/or a duration the sensed temperature exceeds a threshold (e.g., higher for a longer duration or lower for a shorter duration).

If the fan 154 is not at the maximum speed, then the speed of the fan 154 may be increased by X % (e.g., about an additional 10%), and the loop starts over (i.e., measuring the battery temperature and the charger temperature). It should be understood that, in other embodiments, the speed of the fan 154 may be increased by a different amount (e.g., 5%, 15%, 25%, etc.)). Also, the increase in the speed of the fan 154 may be based on the sensed temperature and/or duration the sensed temperature exceeds a threshold.

If the fan 154 is at the maximum speed, the microcontroller may determine the charging current output of the charger 10. If the charging current output is not 0 A, then the charge current may be reduced by X % (e.g., about 10%), and the loop may start over (i.e. measuring the battery temperature and the charger temperature). It should be understood that, in other embodiments, the charge current may be reduced by a different amount (e.g., 5%, 15%, 25%, 50%, etc.)). Also, the reduction in the charge current may be based on the sensed temperature and/or duration the sensed temperature exceeds a threshold.

The microcontroller determines the charger temperature and controls the speed of the fan 154 regardless whether either of the batteries 14A, 14B is coupled to the charger 10. The microcontroller deactivates the fan 154 only if the sensed temperature is below a threshold (e.g., a lower limit of the charger 10).

Thus, the utility model may provide, among other things, a charger 10 operable to charge different types of batteries 14A, 14B at the same time, and a method for dissipating heat regardless whether the batteries 14A, 14B are coupled to the charger 10. The charger 10 may include structure (e.g., a diverter) integral with and positioned within the housing 18 and operable to direct air flow from the inlet 96 through the housing 18 to the outlet 104. The inlet 96 and the outlet 104 may be defined by adjacent sides (e.g., the front and the side 56) or on opposite sides (e.g., the front and the back).

Figure 11A:
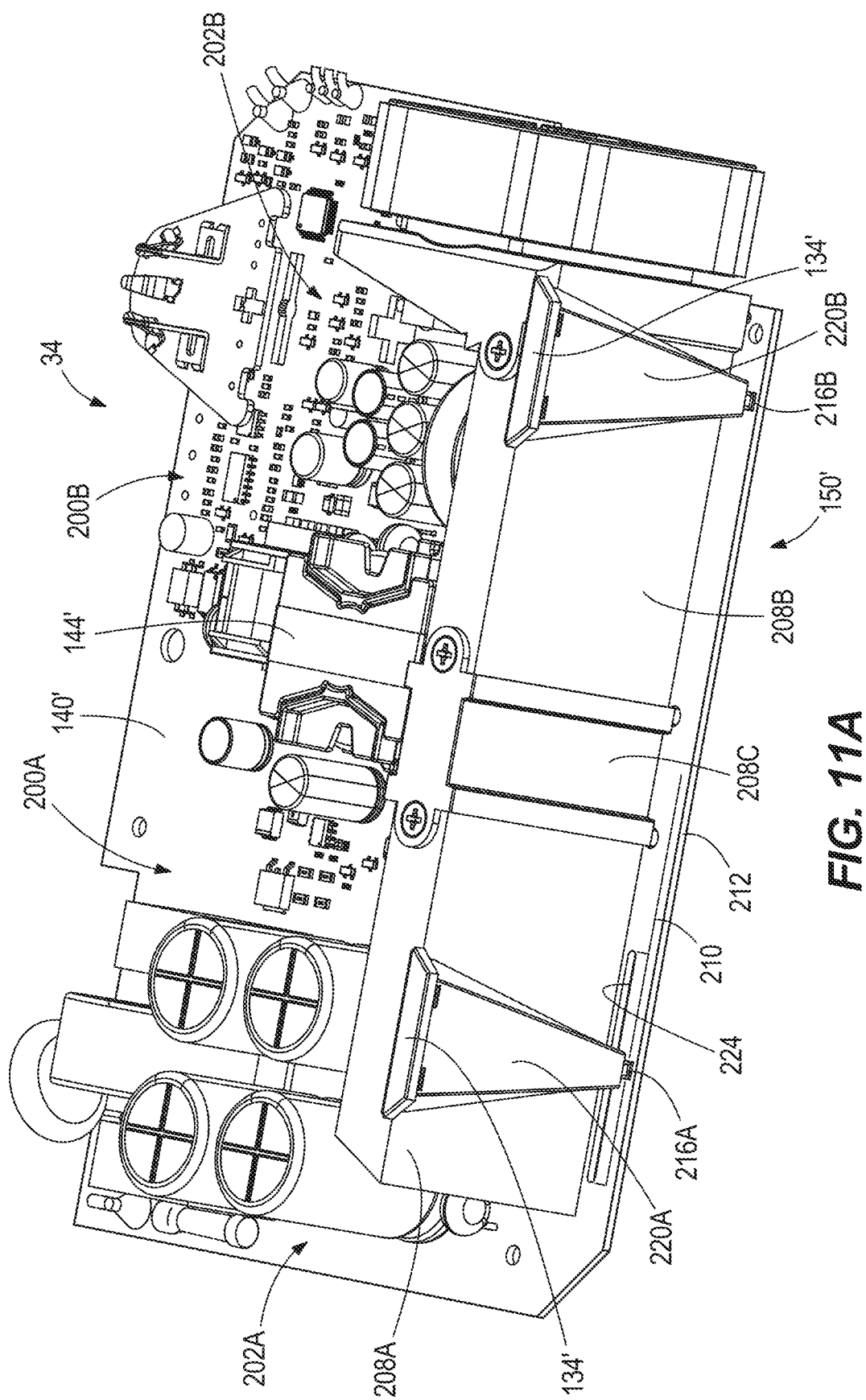
FIG. 11A is a rear perspective view of a portion of a battery charger including a circuit board.
Figure 11B:
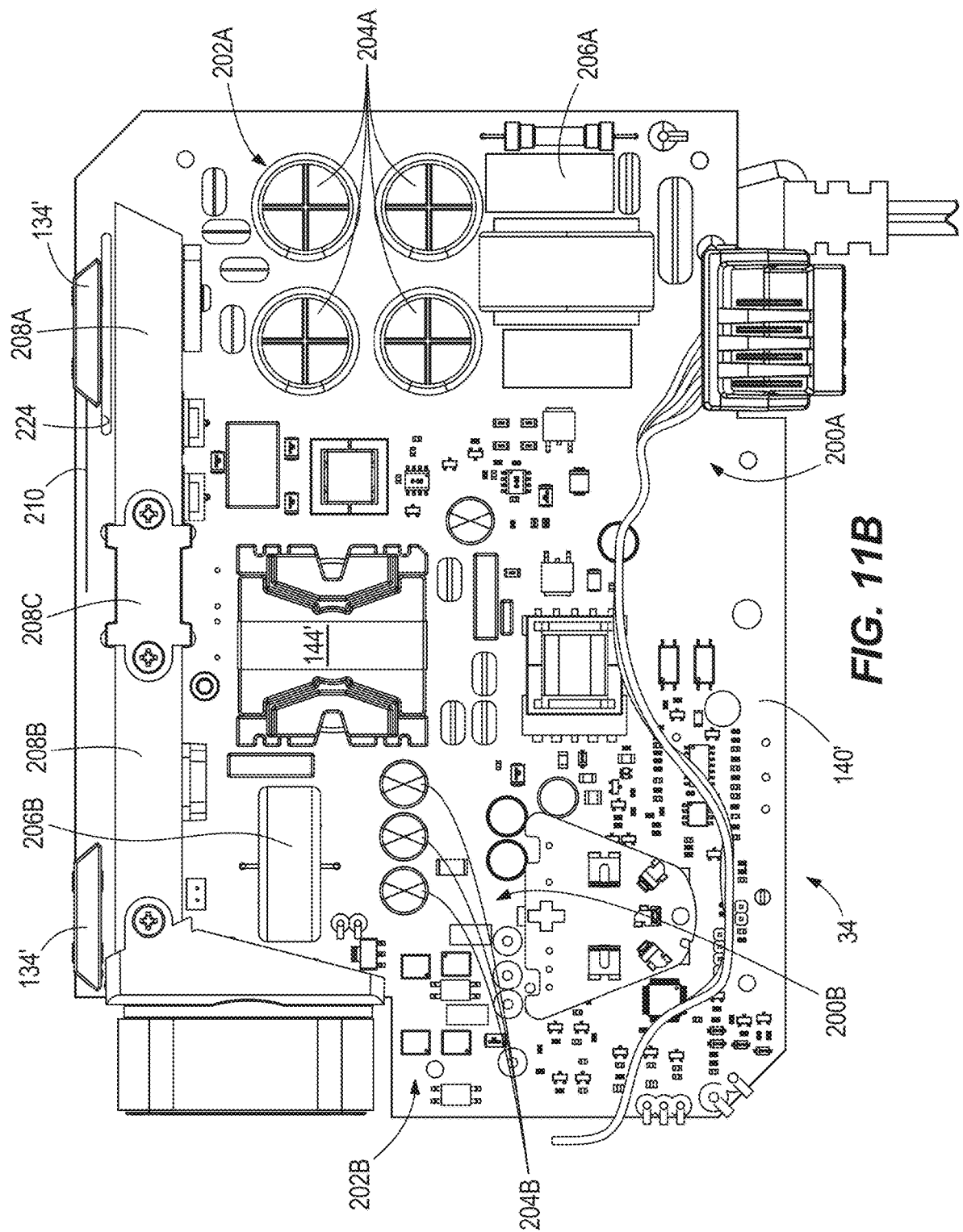
FIG. 11B is a top view of the portion of the charger of FIG. 11A.

FIGS. 11A-11B illustrate a charger 10 and charger electronics 34 including a printed circuit board (PCB) 140' positionable within the housing 18. A plurality of portions 200A, 200B form the PCB 140, 140'. Similar to the PCB 140, the PCB 140' includes a transformer 144', positioned between the portions 200A, 200B. The PCB 140' is configured to facilitate charging of the one or more batteries 14A, 14B.

Alternating current (AC) electrical components 202A, operable to receive AC power from a power source (e.g., line power through the cord 30), are supported on the first portion 200A, and direct current (DC) electrical components 202B, operable to output DC power to charge the battery pack(s) 14A, 14B, are supported on the second portion 200B. The AC electrical components include (see FIG. 11B), among other things, capacitors 204A, a resistor 206A, inductors, etc. The DC electrical components include, among other things, capacitors 204B, an inductor 206B, resistors, etc.

A heat sink assembly 150' is in heat transfer relationship with the AC and DC electrical components 202A, 202B of the charger electronics 34. In the illustrated embodiment, the heat sink assembly 150' is mounted onto and in contact with the PCB 140'. Heat transfers from the heat-generating electrical components 202A, 202B on the PCB 140' to the heat sink 150' through conduction. The heat sink 150' is configured to be disposed in the housing 18 proximate the rear 54, similar to the heat sink 150.

The illustrated heat sink assembly 150, 150' includes a number (e.g., three shown) of portions 208A, 208B, 208C extending across a width of the PCB 140, 140', respectively. The first and second portions 208A, 208B are formed of the heat-conducting material, such as, for example, aluminum, which is also electrically conductive. The first portion 208A of the heat sink 150' may be defined as the AC heat sink, and the second portion 208B of the heat sink 150' may be defined as the DC heat sink. The third portion 208C is formed of non-electrically-conducting material, such as, for example, plastic, and is positioned between and electrically insulates the AC and DC heat sink portions 208A, 208B. The heat sink portions 208A, 208B, 208C are configured such that the air flow is directed through each of the portions 208A, 208B, 208C as described above with respect to the heat sink 150. Furthermore, in the illustrated embodiment, the third portion 208C includes the slot (not shown) proximate the transformer 144 for directing a portion of the air flowing through the heat sink 150' over the transformer 144.

With particular reference to FIG. 7, the light source (e.g., the LED; not shown) for each light pipe 190 is positioned on the DC portion 200B of the PCB 140 (e.g., proximate the DC heat sink 208B). The LEDs are powered by DC power, and the light pipes 190 are constructed to direct the light to the respective indicators on the top portion 42A of the housing 18. In the illustrated embodiment, the light pipes 190 are bendable or flexible such that the desired position of the respective indicators on the top portion 42A may be achieved.

With particular reference to FIGS. 11A-11B, the PCB 140' includes an in-board trace 210 (FIG. 11A) extending from the DC portion 200B of the PCB 140' proximate the third heat sink portion 208C along a rear edge 212 of the PCB 140' to proximate the AC heat sink 208A and the AC portion 200A. The illustrated in-board trace 212 extends between opposite ends 214A, 214B.

Figure 13:
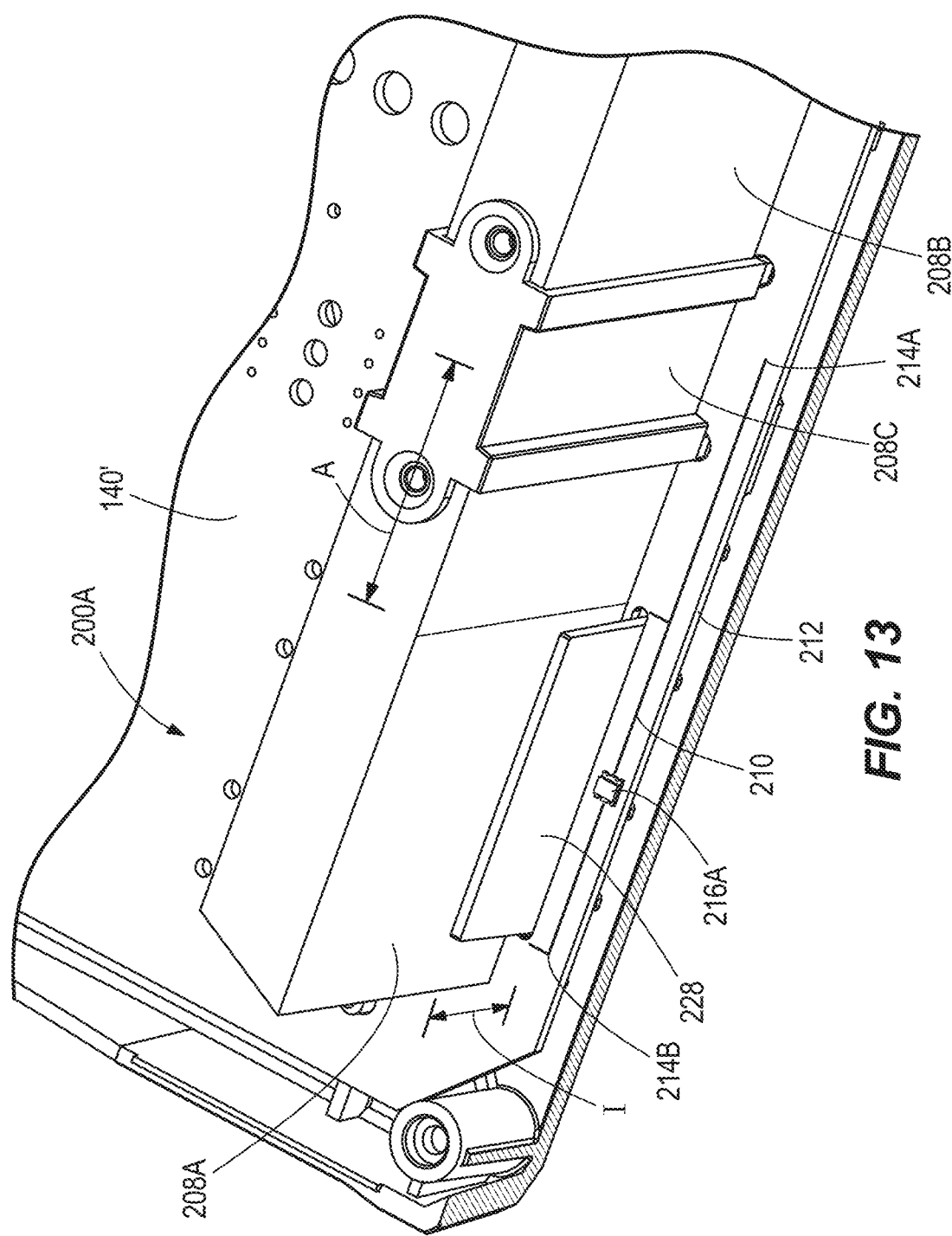
FIG. 13 is an enlarged rear perspective view of the portion of the charger of FIG. 11A, illustrating a light source.
Figure 13A:
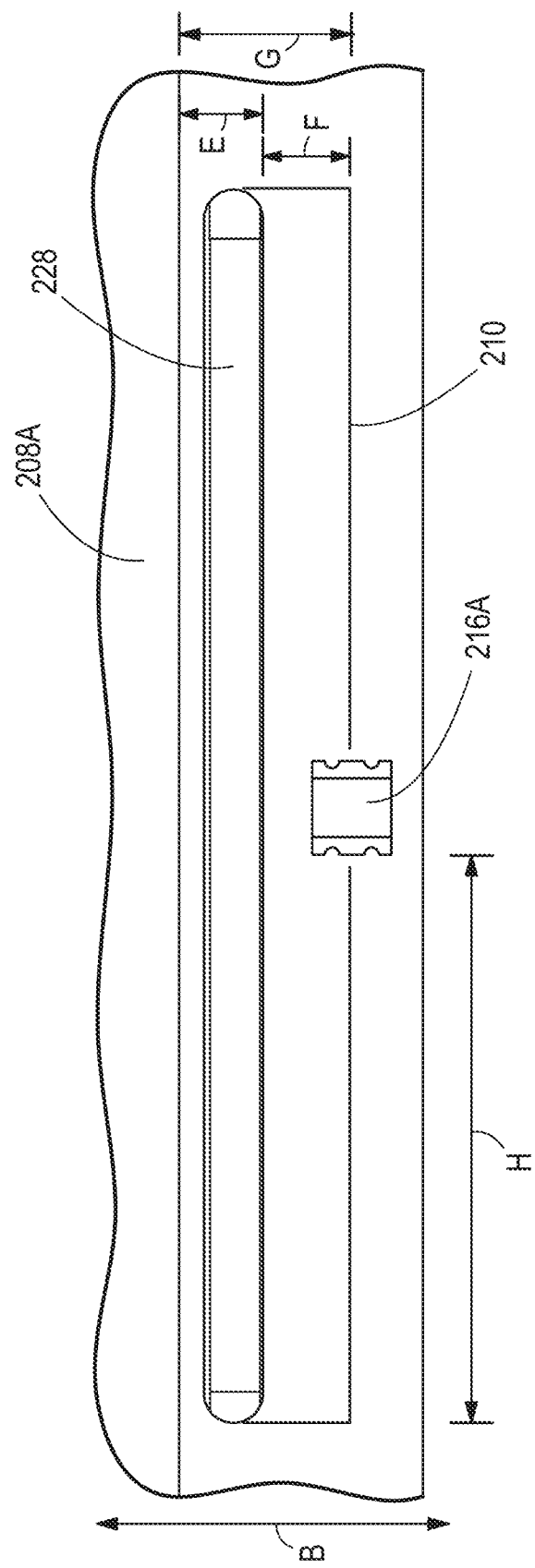
FIG. 13A is an enlarged top view of a portion of the circuit board of FIG. 13.

With reference to FIGS. 11A and 13, in the illustrated construction, a LED 216A is positioned on and electrically connected to the in-board trace 210. As such, the LED 216A is powered by DC power from the DC portion 200B of the PCB 140' but is positioned on the AC portion 200A. In the illustrated construction, the position of the LED 216A is adjustable along the trace 210 so that the LED 216A may be appropriately positioned relative to the indicator defined by the opening 130A within the housing 18 (e.g., directly below the indicator above the AC portion 200A of the PCB 140, 140'). In the illustrated embodiment, the LED 216A is positioned intermediate the first and second ends 214A, 214B of the in-board trace 210. Specifically, the LED 216A is positioned at a distance A from the first end 214A. The distance is adjustable such that the position of the LED 216A on the AC portion 200A is adjustable as necessary to be positioned relative to the indicator.

Another LED 216B is positioned proximate the DC heat sink 208B for providing light to the indicator defined by the opening 130B. A light directing member 220A, 220B extends between an associated LED 216A, 216B and an indicator lens 134A', 134B' positioned within each opening 130A, 130B. Due to the positioning of the LED 216A, 216B, the light directing members 220A, 220B have a substantially linear shape in a vertical direction from the PCB 140'.

An isolating member 228 is positioned between the LED 216A and the heat sink portion 208A. The isolating member 228 is formed of non-conducting material, such as, for example, plastic, and is operable to isolate the LED 216A on the AC portion 200A from interference caused by proximity to the AC components 202A and electrically-conductive components (e.g., the heat sink portion 208A).

Figure 12:
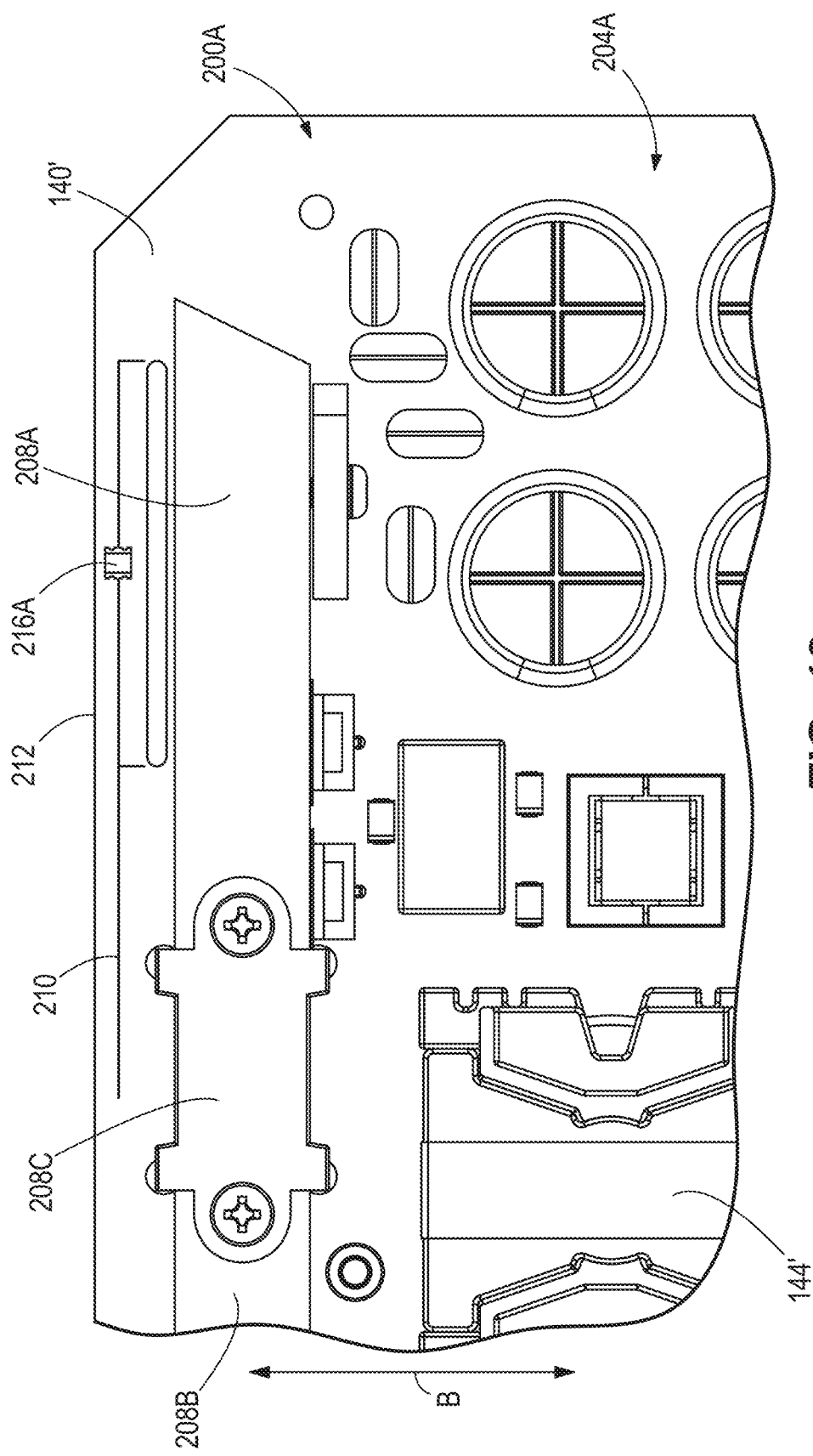
FIG. 12 is an enlarged top view of a portion of the charger of FIG. 11A.

With reference to FIGS. 12-13, the PCB 140' includes a slot 224 extending along a portion of the AC heat sink portion 208A and the in-board trace 212. The slot 224 is configured to receive the isolating member 228 (FIG. 13). Specifically, in the illustrated embodiment, the isolating member 228 extends from the bottom housing portion 42B through the slot 224. In other embodiments (not shown), the isolating member 228 may extend from the top housing portion 42A. Still further, in other embodiments (not shown), the isolating member 228 may be positioned on the PCB 140', and the PCB 140' may not include the slot 224 to receive the isolating member 228. In such a construction, isolating material may be provided on the PCB 140' on which the isolating member 228 may be mounted.

The illustrated isolating member 228 has a generally box-like shape and is positioned between the LED 216A and the AC heat sink portion 208A. A lateral direction B of the charger 10 extends through opposite sides of the isolating member 228 (e.g., its thickness). In some embodiments, the thickness may be about 1 millimeter (mm) or more. Still further, in some embodiments, the thickness may be between about 1 mm and about 2.2 mm. In the illustrated embodiment, the thickness is about 1.6 mm.

The isolating member 228 is positioned at a distance E from the AC heat sink portion 208A (e.g., about 2.6 mm in the illustrated construction). In addition, the LED 216A is spaced from the isolating member 228 by a distance F along the lateral direction B (e.g., about 7.4 mm in the illustrated construction). Rather than being linear, in other constructions (not shown), the isolating member 228 may curve around the LED 216A with a radius of curvature being equal to or greater than the distance F.

In the illustrated construction, a total distance G that the LED 216A is spaced from the AC heat sink portion 208A is about 10 mm. In other embodiments, the total distance G is at least about 8 mm, the minimum over-surface distance (creepage) between the LED 216A and the AC heat sink portion 208A. Still further in other embodiments, the total distance G is between about 10 mm and about 12 mm.

The opposite ends of the isolating member 228 are spaced from the LED 216A by a distance H (e.g., about 18.6 mm or more). In some embodiments, the distance H is about 18.664 mm or more. Furthermore, in some embodiments, the distance is between about 18.664 mm and about 22.8664 mm. In the illustrated embodiment, the distance H is about 18.8664 mm. In the illustrated construction, the LED 216A is positioned equidistant between the ends of the isolating member 228. Furthermore, in other embodiments, the distance H is about 8 mm or more.

The isolating member 228 may be sized to facilitate adjustment of the LED 216A on the trace 212. The size of the isolating member 228 may be sufficient to maintain a minimum distance (e.g., about 18.8664 mm) between the LED 216A and the proximate edge of the isolating member 228 in the various adjusted positions of the LED 216A along the trace 212. In other constructions, the isolating member 228 may also be adjusted to a position corresponding to the position of the LED 216A.

The top of the isolating member 228 is spaced above the LED 216A by a distance I which may be the same as or different than the distance H. In some embodiments, the distance I is about 14.8 mm or more (e.g., 14.8677 mm in the illustrated construction). In some embodiments, the distance is between about 14.8677 mm and about 18.8677 mm. Furthermore, in other embodiments, the distance I is about 8 mm or more.

In other constructions (not shown), the isolating member 228 may have a different shape. For example, the isolating member 228 may be curved. With the curved isolating member 228, a horizontal distance from the LED 216A to the lateral edge of the isolating member 228 may be at least the minimum distance (e.g., 8 mm to each side), a vertical distance from the LED 216A to the top of the isolating member 228 may be at least the minimum (e.g., about 8 mm), and the wall of the isolating member 228 may be curved therebetween. In still other constructions (not shown), portions of the isolating member 228 beyond the minimum distances may be removed (e.g., the corner portions removed to approximate the curved isolating member 228).

Thus, the utility model may provide, among other things, a charger 10 with a LED 216A supported on an AC side of a PCB 140' and isolated from electrical interference by AC components on the PCB 140'. The charger 10 may include a LED that is adjustably positioned on the AC side of the PCB 140'.

Although the utility model has been described in detail with reference to certain preferred embodiments, variations and modifications exist within the scope and spirit of one or more independent aspects of the utility model as described.

One or more independent features and/or independent advantages of the utility model may be set forth in the claims.

What is claimed is:

1. A battery charger comprising:
a housing including a support portion configured to interface with a battery;
charging circuitry configured to charge the battery;
a printed circuit board (PCB) supported by the housing, the PCB supporting alternating current (AC) electrical components;
an indicator supported on the housing, the indicator including a light-emitting diode (LED) supported on the PCB and operable to emit light; and
an isolating member positioned between the AC electrical components and the LED.

2. The charger of claim 1, wherein:
the housing defines an opening through which light from the LED is visible; and
the LED is positioned substantially vertically below the opening.

3. The battery charger of claim 1, wherein a first support portion is positioned above a first portion of the PCB.

4. The battery charger of claim 3, wherein a second support portion is positioned above a second portion of the PCB.

5. The battery charger of claim 4, wherein:
the indicator is a first indicator associated with the first support portion; and
the charger further includes a second indicator associated with the second support portion.

6. The battery charger of claim 5, wherein:
a trace on the PCB is electrically connected to the second portion of the PCB, the trace extending from the second portion and along the first portion, the LED being electrically connected to the trace; and
the LED is positioned along the length of the trace.

7. The battery charger of claim 1, wherein:
the PCB defines a slot; and
the housing includes a rib received through the slot and providing the isolating member positioned between the AC electrical components and the LED.

8. The battery charger of claim 1, wherein the indicator includes a light directing member directing light from the LED to the opening.

9. The battery charger of claim 8, wherein the light directing member is substantially linear.

10. The battery charger of claim 1, further comprising:
a heat sink supported on the PCB,
wherein the isolating member is formed of electrically-insulating material and the heat sink is formed of electrically-conductive material.

11. The battery charger of claim 10, further comprising:
a fan positioned at a first end of the heat sink.

12. The battery charger of claim 11, wherein the fan is a multi-speed fan configured to rotate at more than one speed.

13. The battery charger of claim 12, wherein the speed of the fan is determined based upon a temperature of one or more of the AC electrical components on the PCB.

14. The battery charger of claim 12, wherein the speed of the fan is determined based upon a temperature of the heat sink.

15. A battery pack charger comprising:
a housing including a support portion configured to interface with a battery pack;
charging circuitry configured to charge the battery pack;
a printed circuit board (PCB) supported by the housing, the PCB supporting alternating current (AC) electrical components;
an indicator supported on the housing and associated with the support portion, the indicator including a light-emitting diode (LED) supported on the PCB and operable to emit light;
an isolating member positioned between the AC electrical components and the LED; and
a heat sink positioned on the PCB;
wherein the isolating member is formed of electrically-insulating material and the heat sink is formed of electrically-conductive material.

16. The battery pack charger of claim 15, further comprising:
a multi-speed fan is positioned at a first end of the heat sink.

17. The battery pack charger of claim 16, wherein a speed of the multi-speed fan is determined based on the temperature of at least one selected from a group consisting of: an electrical component on the PCB, the heat sink, and the battery pack.

18. The battery pack charger of claim 16, wherein a speed of the multi-speed fan is determined regardless of whether the battery pack is interfaced with the support portion.

19. The battery pack charger of claim 16, wherein the multi-speed fan is configured to direct air flow toward an outlet disposed in the housing.

20. A battery pack charger comprising:
a housing including a support portion configured to interface with a battery pack;
charging circuitry configured to charge the battery pack;
a printed circuit board (PCB) supported by the housing, the PCB supporting alternating current (AC) electrical components;
an indicator supported on the housing and associated with the support portion, the indicator including a light-emitting diode (LED) supported on the PCB and operable to emit light;

an isolating member positioned between the AC electrical components and the LED; and a multi-speed fan configured to direct air flow toward an outlet disposed in the housing;

wherein a speed of the multispeed fan is set based on a temperature associated with the battery pack charger.

* * * * *